(12) United States Patent
Tian et al.

(10) Patent No.: US 7,715,197 B2
(45) Date of Patent: May 11, 2010

(54) COINED-SHEET-METAL HEATSINKS FOR CLOSELY PACKAGED HEAT-PRODUCING DEVICES SUCH AS DUAL IN-LINE MEMORY MODULES (DIMMS)

(75) Inventors: Shurong Tian, Mount Kisco, NY (US); Thomas M. Cipolla, Katonah, NY (US); Paul W. Coteus, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/133,547

(22) Filed: Jun. 5, 2008

(65) Prior Publication Data

US 2009/0303681 A1 Dec. 10, 2009

(51) Int. Cl.
*H05K 7/20* (2006.01)
(52) U.S. Cl. .................. 361/719; 361/704; 361/715; 361/721; 257/718; 257/719; 165/80.3; 165/185
(58) Field of Classification Search .......... None
See application file for complete search history.

(56) References Cited

U.S. PATENT DOCUMENTS

| | | | |
|---|---|---|---|
| 5,109,318 A * | 4/1992 | Funari et al. ........... 361/710 |
| 5,513,135 A | 4/1996 | Dell et al. | |
| 5,815,371 A * | 9/1998 | Jeffries et al. ........... 361/704 |
| 6,173,382 B1 | 1/2001 | Dell et al. | |
| 6,297,966 B1 * | 10/2001 | Lee et al. ................. 361/799 |
| 6,424,532 B2 * | 7/2002 | Kawamura ............... 361/708 |
| 6,510,100 B2 | 1/2003 | Grundon et al. | |
| 6,535,387 B2 * | 3/2003 | Summers et al. ......... 361/704 |
| 6,587,912 B2 | 7/2003 | Leddige et al. | |
| 7,106,595 B2 * | 9/2006 | Foster et al. ............. 361/721 |
| 7,349,219 B2 * | 3/2008 | Lai et al. ................. 361/719 |
| 2007/0070607 A1 * | 3/2007 | Goodwin ................. 361/719 |
| 2008/0011453 A1 * | 1/2008 | Liang ..................... 165/80.3 |
| 2009/0002951 A1 * | 1/2009 | Legen et al. ............ 361/715 |
| 2009/0103269 A1 * | 4/2009 | Liu et al. ................ 361/719 |

* cited by examiner

*Primary Examiner*—Boris L Chervinsky
(74) *Attorney, Agent, or Firm*—Scully, Scott, Murphy & Presser, P.C.; Daniel P. Morris, Esq.

(57) ABSTRACT

A heatsink structure and method for the cooling of closely spaced packaged heat-producing devices, such as dual-in-line memory modules (DIMMs). A folded sheet metal heatsink structure is provided which is constituted of a coined metallic material and which has a large plurality of waffle-shaped ridges extending therefrom constituting additional surface areas which are adapted to enable heat generated by hub chips to pass upwardly and then outwardly through waffle-like ridges and, thus, dissipated to the exterior, thereby imparting an improved degree of cooling to heat-producing components or devices.

19 Claims, 5 Drawing Sheets

COINED-SHEET-METAL HEATSINKS FOR CLOSELY PACKAGED HEAT-PRODUCING DEVICES SUCH AS DUAL IN-LINE MEMORY MODULES (DIMMS)

BACKGROUND OF THE INVENTION

1. Field of the Invention

The present invention relates to a heatsink structure for the cooling of closely spaced packaged heat-producing devices, such as dual-in-line memory modules (DIMMs). Furthermore, the invention is directed to a method of utilizing the heatsink structure for the cooling of heat-producing devices pursuant to the present invention.

2. Discussion of the Prior Art

The efficient cooling of closely spaced heat producing devices, particularly electronic packaging components, such as pluralities of DIMMs which are positioned on processor circuit cards, for example, dynamic, random-access memories (DRAMs) is extremely difficult to implement through the applications of prior art type finned heatsink structures because of the space taken up by them or flat heatsink structures because of their thermal inefficiency.

For instance, such heat-producing devices, which necessitate adequate cooling facilities, are widely known in the electronic and computer technologies.

Leddige, et al., U.S. Pat. No. 6,587,912 B2, which is commonly assigned to the present assignee, disclose a method and apparatus wherein a computer system memory module includes a structure for implementing multiple memory buses, incorporating a bi-directional repeater hub wherein the system regenerates memory signals for coupling to a memory bus.

Grundon, et al., U.S. Pat. No. 6,510,100 B2 provide for synchronous memory modules and memory systems with selectable clock termination.

Finally, Dell, et al., U.S. Pat. Nos. 6,173,382 B1 and 5,513,135, which are both commonly assigned to the present assignee, disclose, respectively, diagrammatic memory module configurations and single/dual in-line memory module structures and fabrication methods.

However, none of the above-referenced patent publications are directed to the provision of heatsinks for cooling the devices disclosed therein analogous to the present invention.

In essence, pursuant to the present state-of-the-art prior art, various types of heatsinks may be either constituted of sheet metal members, which basically provide for limited degrees of heat dissipation and cooling, but which may be adequate for situations when the spacing between the different memory cards, modules or similar-types of heat-producing devices contained in electronic packages is relatively large.

Even the use of fins possessing relatively short structures on such sheet metal devices may be adequate in those instances; however, they fail to provide sufficient degrees of cooling when the heat-producing devices, such as the DIMMs, which are located on processor circuit cards, are closely spaced with each other.

More recently, some action has been taken in the cooling technology for heat-producing devices in order to provide enhanced cooling efficacies through the employment of essentially folded sheet metal heatsinks, the latter of which encompass both sides of respective heat-producing device; such as DIMM devices, which are designed with surface areas facing the overall larger surfaces of the DIMMs, with the heatsink further having apertures or pluralities of openings formed therein allowing for the through-passage and resultant dissipation of heat. A provision is made for corrugated heatsinks provided with diverse types of openings, which are deemed to provide only limited cooling efficiencies. Although these folded heatsink structures are superior over the previous known types of commonly employed heatsinks, such as sheet metal or finned structures, they still fail to provide for adequate cooling of closely spaced DIMMs, which are located on the processor circuit cards.

SUMMARY OF THE INVENTION

Accordingly, in order to improve upon the foregoing state-of-the-art heatsink structures, pursuant to the present invention there is provided a folded sheet metal heatsink structure which is constituted of a coined metallic material which has a large plurality of waffle-shaped ridges constituting additional surface areas which are adapted to enable heat generated by the DRAM chips to pass upwardly and then outwardly through the present waffle-like ridges and, thus, dissipated to the exterior, thereby imparting an improved degree of cooling to the heat producing components or devices. Even more specifically, besides providing an increased surface area which enhances cooling, the ridges impart a better flow performance to the cooling air by destroying or breaking the boundary layer formed at the heatsink base, rather than a plain one-piece sheet metal heatsink.

The inventive coined sheet metal heatsinks, which are of the closely folded structure and adapted to be positioned one over each respective upstanding DIMM, are each also equipped with an interior surface, which is constituted of a thermal interface material having lead-ins which connect to the surface of the DRAM chips, and that facilitate assembly of the applicable heatsink to the memory module. Consequently, as air is passed over the heatsink, the ridges of the waffle pattern any boundary layer, thereby contributing to the efficiency of the heatsink by facilitating greater amounts of heat to be transferred from the heat-producing device, i.e., the DRAM chip, to the air as the latter passes over the heatsink.

The inner lining of the surfaces of the coined sheet metal heatsink is covered by the thermal interface material, such as a thermal tape or thermal glue, enabling the distribution or disposal of the heat generated by the DRAM chip over the surface of the coined sheet metal member and to be dissipated outwardly to the exterior.

Accordingly, it is an object of the present invention to provide novel folded sheet metal heatsinks for closely spaced heat-producing devices, so as to improve the cooling efficacy thereof.

Another object of the present invention resides in the provision of a method of utilizing sheet metal heatsinks having folded constructions for enhancing the cooling efficacy of heat-producing devices, such as dual-in-line memory modules (DIMMs).

BRIEF DESCRIPTION OF THE DRAWINGS

Reference may now be made to the following detailed description of the invention, taken in conjunction with the accompanying drawings; in which.

DETAILED DESCRIPTION OF THE INVENTION

Figure 1:
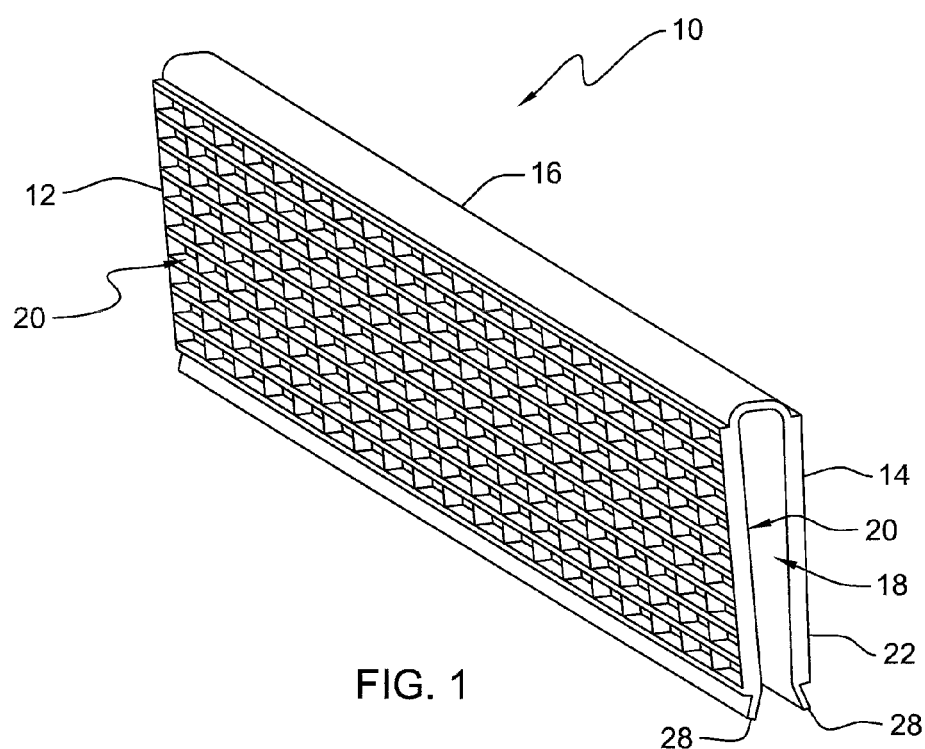
FIG. 1 illustrates a perspective view of a coined and folded sheet metal heatsink structure employable for cooling a dual-in-line memory module.
Figure 1A:
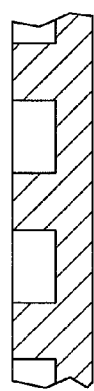
FIGS. 1a and 1b illustrated on an enlarged scale, respectively, partial cross-sectional views of two variants of the coined material that is folded to produce the heatsink pursuant to the present invention.
Figure 1B:

Referring to the drawings in more specific detail, FIG. 1 illustrates a folded heatsink structure 10, consisting of two essentially large planar surface components 12, 14, which are interconnected by an integral segment 16, so as to essentially form an inverted U-shape in traverse cross-section. Each of the large surfaced structures 12, 14, which are spaced essentially in parallel from each other a predetermined space or distance 18, possesses a lattice-like configuration forming a waffle patterned series of ridges 20, which essentially form raised ridges in the surface areas 12, 14, and which will permit air to pass thereover. As shown in FIG. 1a of the drawings, each of the raised ridges 20 in the surface areas 12, 14, present an essentially rectangular waffle pattern in cross-section. Alternatively, the waffle pattern represented in FIG. 1b may be of a generally frusto-conical cross-sectional configuration. However, it is also possible to contemplate other cross-sections; for example, such as hemispherical, or the like.

As indicated, the ends 20, 22 of each of the planar members 12, 14 are bent into essentially flange-shaped elements, the lower end of each of which provides for a lead-in structure 28 to facilitate assembly of the heatsink 10 to a memory module (DIMM) 30, as shown hereinbelow with regard to FIG. 3 of the drawings.

Figure 2:
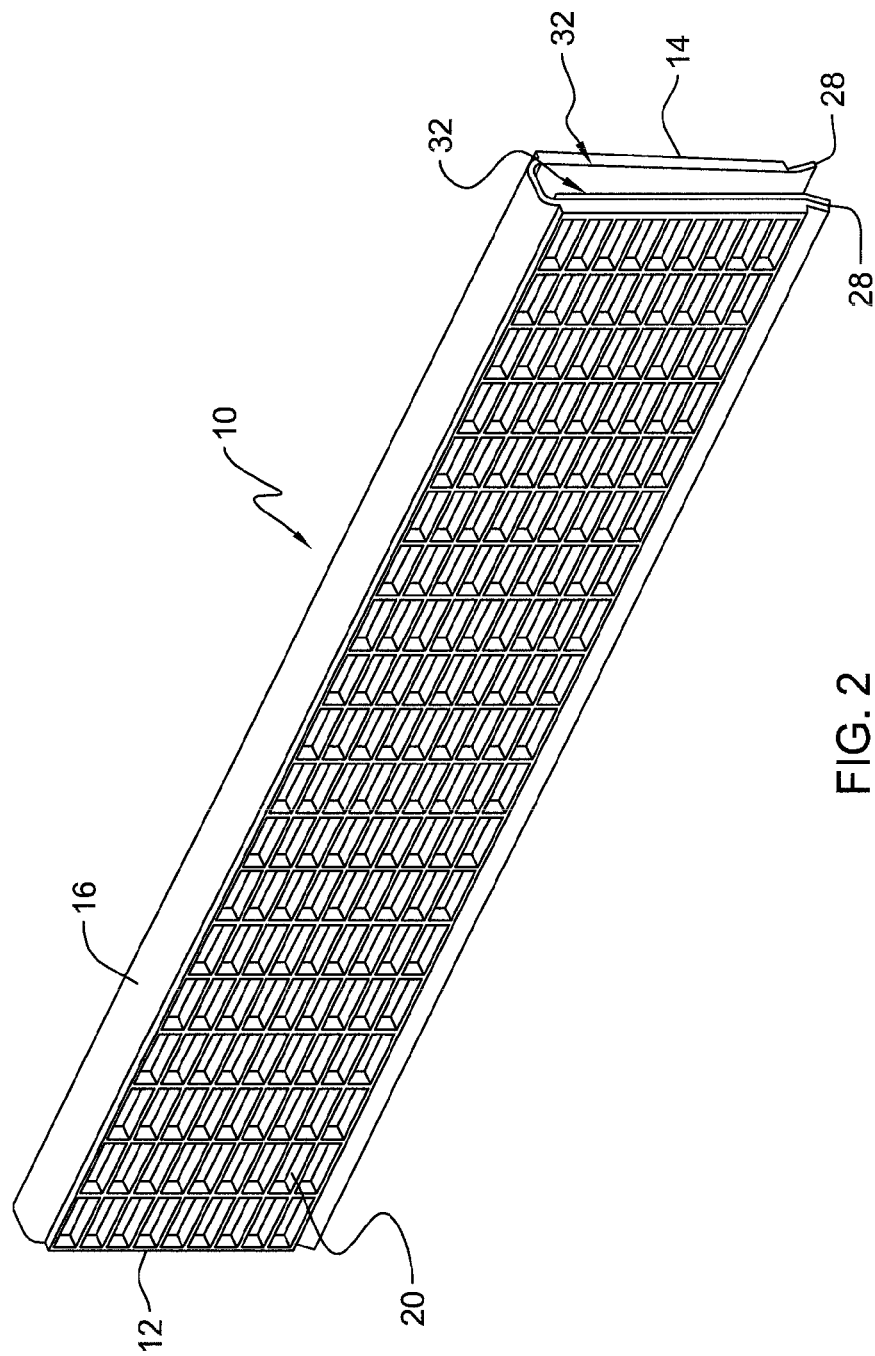
FIG. 2 illustrates a perspective view of a coined and folded sheet metal heatsink structure which is similar to FIG. 1; and which is lined with a thermal interface material.

The planar members 12, 14 are formed by a coined sheet metal material, and are essentially a waffle-shaped latticework, have the inner surfaces of the planar surface members each covered by a layer of a thermal interface material 32, for example, such as by a thermal tape or thermal glue, as shown in FIG. 2 of the drawings.

With regard to the heatsink structure of FIG. 2 of the drawings, which essentially corresponds in overall configuration to that of FIG. 1; whereas in that instance, the lattice shaped ridges 20, as shown, may optionally be more elongated in nature, rather than being rectangularly waffle-shaped as those in FIG. 1, whereas for the remainder, both configurations of FIGS. 1 and 2 are similar and are identified by identical reference numerals. Other non-rectangular shapes may be used as well.

Figure 3:
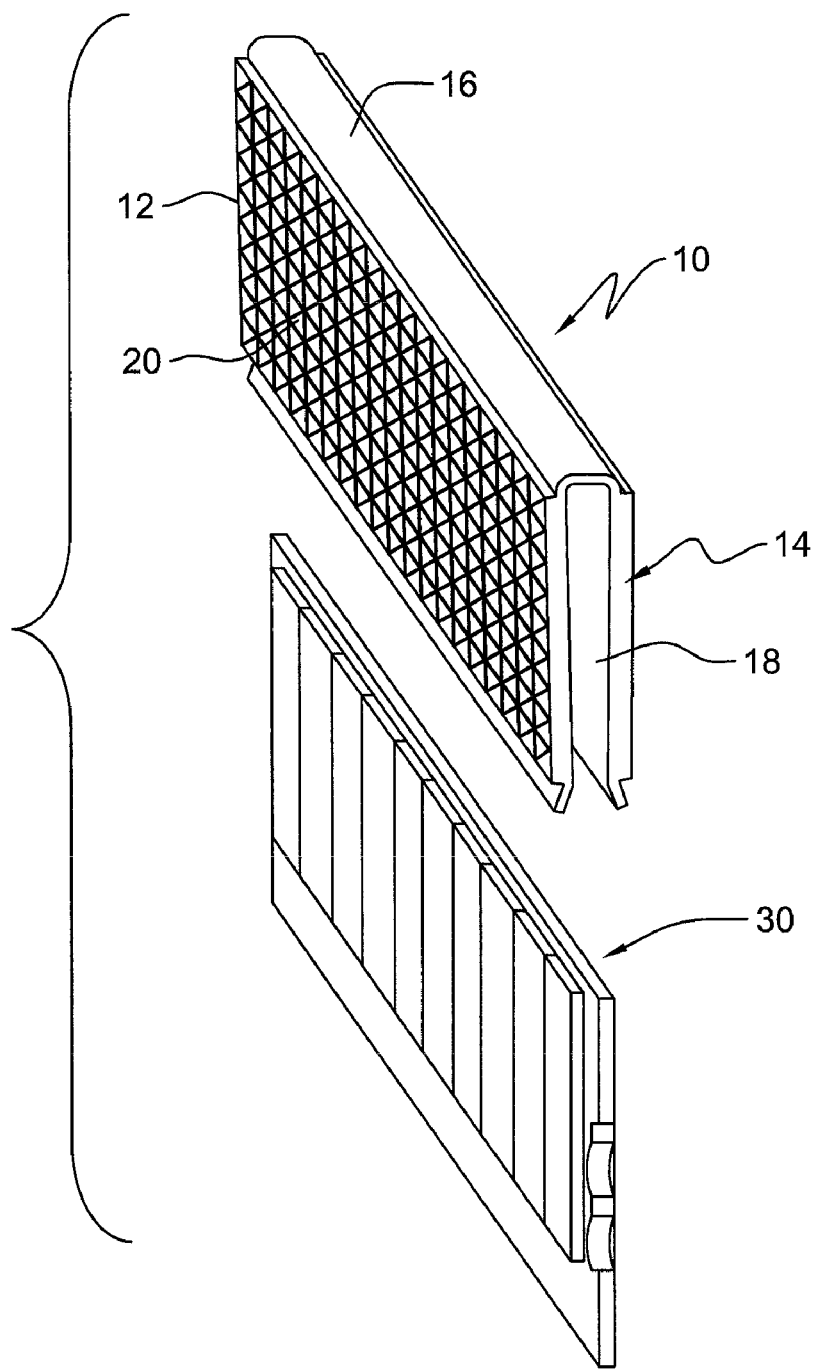
FIG. 3 illustrates, in an exploded perspective view, the heatsink of FIG. 2 and a memory module which is adapted to be inserted therein.
Figure 4:
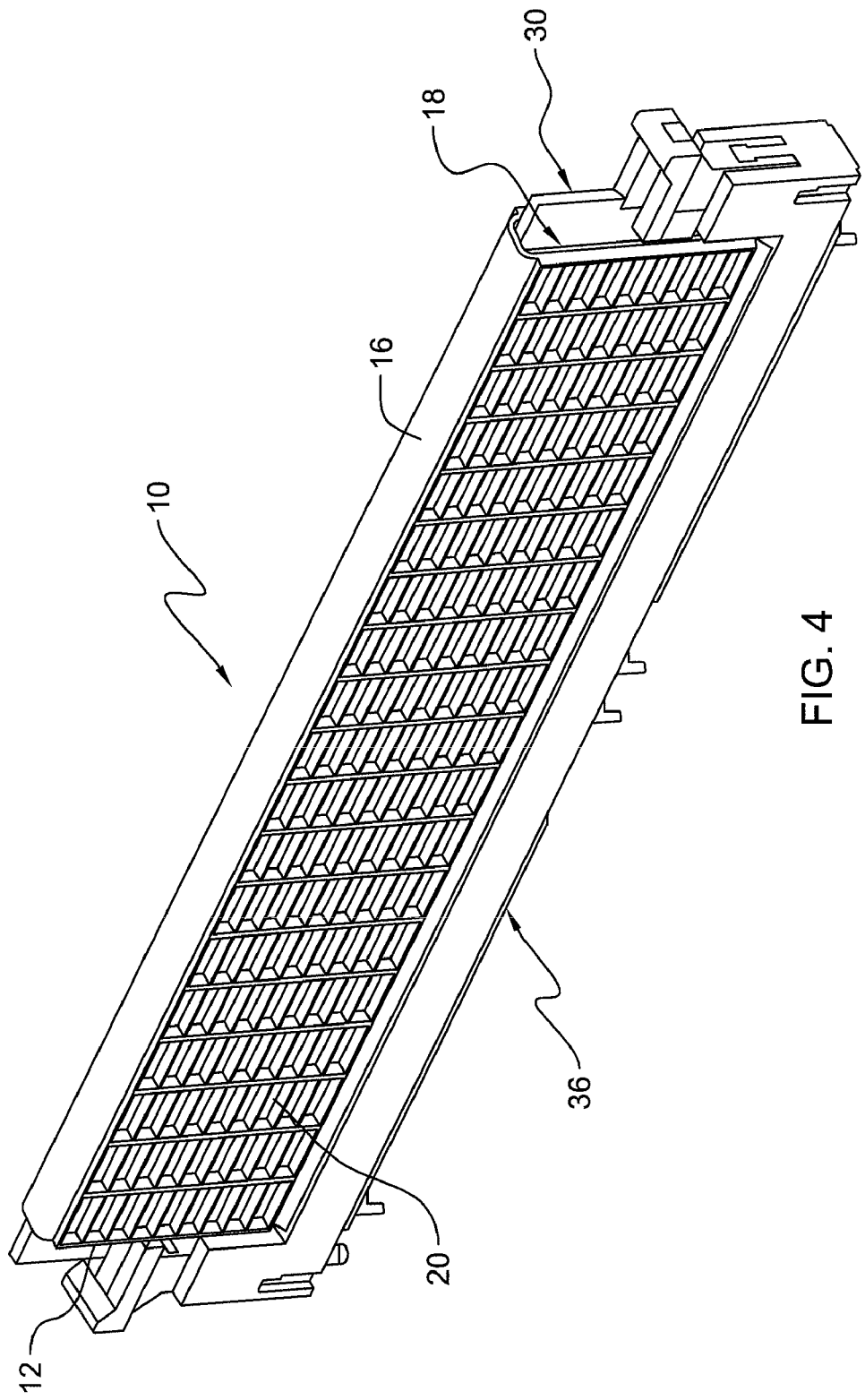
FIG. 4 illustrates a perspective view of the heatsink of FIG. 2, shown assembled with the memory module and mounted on a memory module connector structure.

As shown in FIG. 3 of the drawings, a dual-in-line memory module (DIMM) 30 is adapted to be slid into the space 18 between the two surface portions 12, 14 of the heatsink structure 10, and with the lower end thereof being connectable to a memory module connector structure 36, as diagrammatically shown in FIG. 4 of the drawings, the latter structure 36 being essentially known in the technology.

Figure 5:
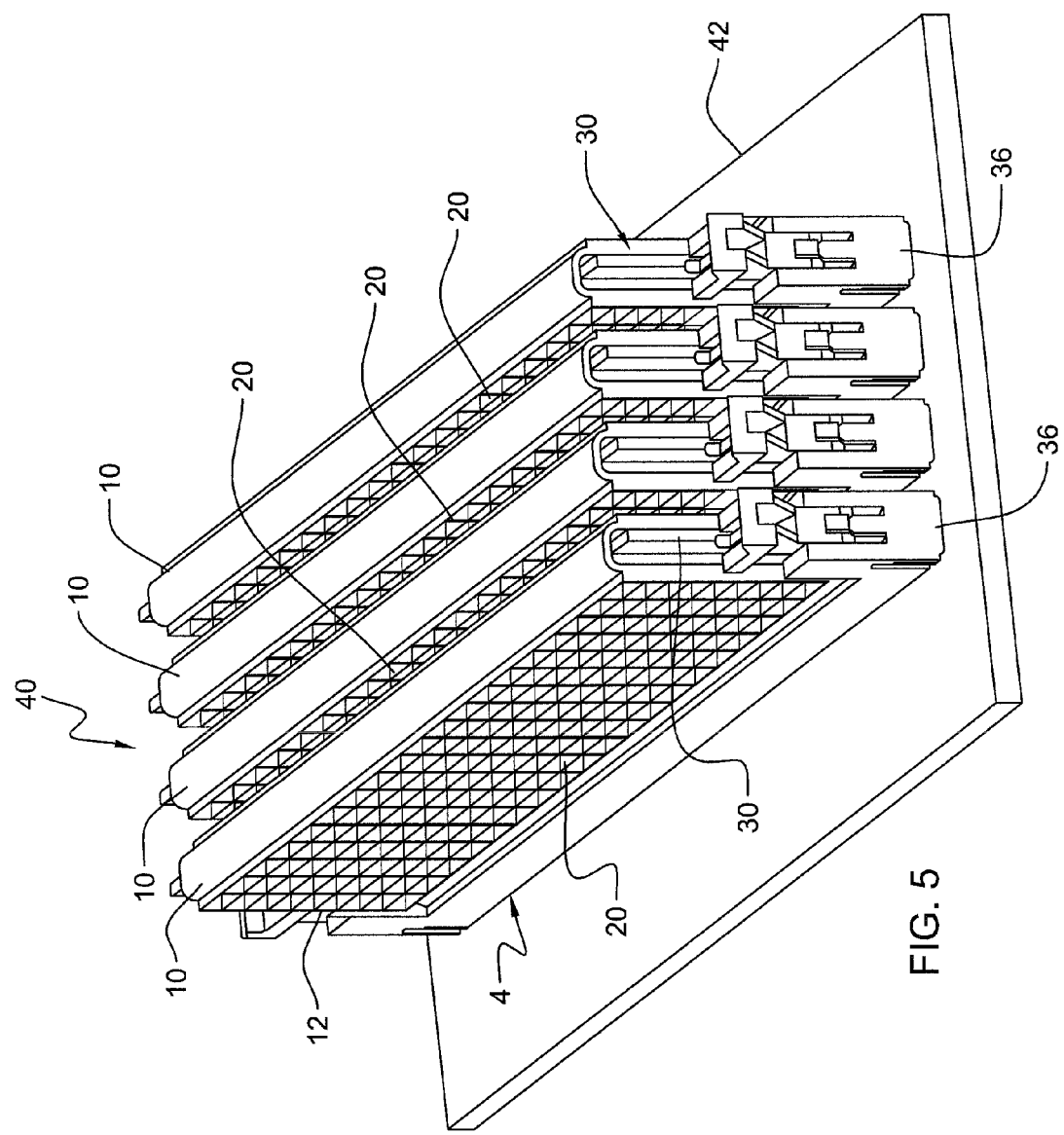
FIG. 5 illustrates a perspective view of a plurality of closely positioned coined and folded sheet metal heatsinks positioned on memory modules and mounted on memory connectors which are located on a circuit card.

Thereafter, as illustrated in FIG. 5 of the drawings, a plurality of closely spaced assemblies 40 consisting of, respectively, each a folded heatsink member 10 positioned over an assembled DIMM 30 and memory module connector structure 36, is located on a common base 42 which may be a printed or wired circuit board.

The lead-in structure 28 is provided to facilitate assembly of the various components. Heat is transferred from the base or chip packages 42 through the thermal interface material 32, and through the latticework of each of the surfaces 12, 14 of the heatsink 10 on both sides of each respective memory module to the air so as to dissipate heat and cool the electronic or heat producing component or chip in an optimized mode. The configuration of the waffle-like ridges 20, as shown in FIG. 1 or 2, break up any air boundary layers, and permit a further enhanced flow of air to pass therethrough, so as to improve upon the cooling capacity of the entire arrangement.

Each of the folded heatsinks 10 is constituted of preferably a coined sheet metal material, with the stamped lattice shaped waffle ridges being formed in a simple inexpensive fabricating mode, while providing for maximum cooling effect of the heatsink structure 10.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A heatsink structure for the cooling of a closely packaged heat-producing device, said structure comprising:

a folded arrangement having a pair of members forming spaced internal mutually facing parallel surfaces, said members being interconnected along one end to form an essentially inverted U-shaped configuration;

each of said members possessing an external surface having a plurality of ridges in a waffle-configured lattice array formed therein, said plurality of ridges defining ridges extending in parallel with and ridges extending transversely of a flow of air passing over the external surface of each said member, enabling a boundary layer of air passing over each said external surface to be broken; and generating an enhanced flow of air increasing the cooling capacity of said heat sink structure; and wherein said heatsink structure is capable of having a component positioned in the space between said pair of members in communication with a heat-producing device for receiving heat generated by said heat-producing device and conveying the heat into said space and outwardly through said internal and external surfaces of said members.

2. A heatsink structure as claimed in claim 1, wherein said pair of members is formed from a coined metallic material.

3. A heatsink structure as claimed in claim 2, wherein said coined metallic material is constituted of sheet metal.

4. A heatsink structure as claimed in claim 3, wherein the internal surfaces of said parallel spaced members are each lined with a thermal interface material to facilitate distribution and dissipation of heat generated by said heat-producing device over the internal and external surfaces of the coined metallic sheet metal material for enhanced dissipation thereof outwardly though circulation about said ridges in the external surfaces of said members.

5. A heatsink structure as claimed in claim 4, wherein said thermal interface material selectively comprises a thermal tape or a thermal glue.

6. A heatsink structure as claimed in claim 1, wherein bent flanges are provided on an end of each said members forming the opening to the space distant from said inverted U-shaped connection, said flanges providing a lead-in structure for insertion of said component.

7. A heatsink structure as claimed in claim 6, wherein said component comprises a dual in-line memory module (DIMM).

8. A heatsink structure as claimed in claim 7, wherein said heat-producing device comprises a DRAM semiconductor chip mounting a memory module connector structure.

9. A heatsink structure as claimed in claim 8, wherein a plurality of said heatsink structures each having, respectively, one dual in-line memory module arranged therein are mounted in closely spaced relationships on a processor circuit card.

10. A method of producing a heatsink structure for the cooling of a closely packaged heat-producing device, said method comprising:

a folded arrangement having a pair of members forming internal mutually facing parallel spaced surfaces, interconnecting said members along one end to form an essentially inverted U-shaped configuration;

forming in external surfaces of said members a plurality of ridges in a waffle-configured lattice array, said plurality of ridges defining ridges extending in parallel with and ridges extending transversely of a flow of air passing over the external surface of each said member, enabling a boundary layer of air passing over each said external surface to be broken so as to generate an enhanced flow of air increasing the cooling capacity of said heatsink structure; and positioning a component in said heatsink structure in the space between said pair of members in communication with a heat-producing device for receiving heat generated by said heat-producing device and conveying the heat into said space and outwardly through said plurality of ridges for cooling said device.

11. A method as claimed in claim 10, wherein said pair of members is formed from a coined metallic material.

12. A method as claimed in claim 11, wherein said coined metallic material is constituted of sheet metal.

13. A method as claimed in claim 12, comprising lining said internal surfaces of said parallel spaced members with a thermal interface material to facilitate distribution and dissipation of heat generated by said heat-producing device over the surface of the coined metallic sheet metal material for enhanced dissipation thereof outwardly through circulation about said plurality of ridges in the external surfaces of said members.

14. A method as claimed in claim 13, wherein said thermal interface material comprises selectively a thermal tape or a thermal glue.

15. A method as claimed in claim 10, wherein said waffle-configured array of ridges form additional external surface areas on each of said members enabling heat generated by the heat-producing device to pass upwardly into the ridges of said pair of members and outwardly through said ridges to enhance the degree of dissipation of the generated heat.

16. A method as claimed in claim 10, providing bent flanges on the end of each said members forming the opening to the space distant from said inverted U-shaped connection, said flanges providing a lead-in structure for insertion of said component.

17. A method as claimed in claim 15, wherein said component comprises a dual in-line memory module (DIMM).

18. A method as claimed in claim 17, wherein said heat-producing device comprises a DRAM semiconductor chip mounting a memory module connector structure.

19. A method as claimed in claim 18, wherein a plurality of said heatsink structures each having, respectively, one dual in-line memory module arranged therein are mounted in closely spaced relationships on a processor circuit card.

* * * * *